United States Patent [19]

McAfee et al.

[11] Patent Number: 5,851,731
[45] Date of Patent: *Dec. 22, 1998

[54] COMPOSITION FOR THE MANUFACTURE OF FLEXOGRAPHIC PRINTING PLATES

[75] Inventors: Carl David McAfee, Kennedale; Piseth Lov, Mansfield; David Thomas Hughes, Whitney; Michael Wayne Chase, Arlington, all of Tex.

[73] Assignee: M. A. Hanna Company, Cleveland, Ohio

[ * ] Notice: This patent issued on a continued prosecution application filed under 37 CFR 1.53(d), and is subject to the twenty year patent term provisions of 35 U.S.C. 154(a)(2).

[21] Appl. No.: 707,862

[22] Filed: Sep. 9, 1996

[51] Int. Cl.$^6$ .............................. G03F 7/033; G03F 7/30; G03F 7/038

[52] U.S. Cl. .................................... 430/286.1; 430/287.1; 430/907; 430/911; 430/912; 430/905; 430/909; 430/306; 522/88; 522/109; 522/111; 522/112

[58] Field of Search ........................ 430/287.1, 286.1, 430/907, 911, 912, 905, 909, 306; 522/88, 109, 111, 112

[56] References Cited

U.S. PATENT DOCUMENTS

| | | | |
|---|---|---|---|
| 3,850,770 | 11/1974 | Juna et al. | 430/284.1 |
| 4,177,074 | 12/1979 | Proskow | 430/286.1 |
| 4,198,241 | 4/1980 | Bronstert et al. | 430/284.1 |
| 4,369,246 | 1/1983 | Chen et al. | 430/306 |
| 4,423,135 | 12/1983 | Chen et al. | 430/271.1 |
| 4,427,759 | 1/1984 | Gruetznacher et al. | 430/273.1 |
| 4,460,675 | 7/1984 | Gruetmacher et al. | 430/300 |
| 4,517,279 | 5/1985 | Worns | 430/286.1 |
| 4,604,343 | 8/1986 | Sakurai et al. | 430/281.1 |
| 4,894,315 | 1/1990 | Feinberg et al. | 430/281.1 |
| 4,946,752 | 8/1990 | Tomita et al. | 430/18 |
| 5,073,477 | 12/1991 | Kusuda et al. | 430/287.1 |
| 5,135,837 | 8/1992 | Swatton | 430/273.1 |
| 5,212,049 | 5/1993 | Gersdorf | 430/285.1 |
| 5,238,783 | 8/1993 | Taniguchi et al. | 430/281.1 |
| 5,304,458 | 4/1994 | Berrier et al. | 430/281.1 |
| 5,344,744 | 9/1994 | Ueda et al. | 430/287.1 |
| 5,364,741 | 11/1994 | Huynh-Tran et al. | 430/300 |
| 5,370,968 | 12/1994 | Goss et al. | 430/271.1 |

FOREIGN PATENT DOCUMENTS

94/22057  9/1994  WIPO .

*Primary Examiner*—Cynthia Hamilton
*Attorney, Agent, or Firm*—Killworth, Gottman, Hagan & Schaeff, LLP

[57] ABSTRACT

A water processable photopolymeric composition for use in the manufacture of flexographic photopolymer printing plates is disclosed. Preferably, the flexomer blend includes a flexomer having an affinity for water combined with a hydrophilic crosslinking agent, a nonhydrophilic crosslinking agent, a swell enhancing filler, a hydrophilic plasticizer, a compatibilizer and a surfactant. The compatibilizer aids the blending of the hydrophilic components with the flexomer blend.

21 Claims, No Drawings

COMPOSITION FOR THE MANUFACTURE OF FLEXOGRAPHIC PRINTING PLATES

TECHNICAL FIELD OF THE INVENTION

This invention relates to photopolymer compositions which are suitable for use in the manufacture of flexographic photopolymer printing plates with improved processibility in aqueous media.

BACKGROUND OF THE INVENTION

This invention relates to improved photopolymer compositions suitable for use in the manufacture of flexographic photopolymer printing plates that are processed in aqueous media. The use of photopolymer compositions that are processed in organic solvents or in aqueous media for the manufacture of flexographic photopolymer printing plates is known, but existing photopolymer compositions have unacceptable characteristics.

Before the advent of flexographic photopolymer printing plates, slightly flexible printing plates were manufactured using rubber compounds. A rubber negative of the desired image was created by molding a rubber compound into a rigid plate bearing the image to be reproduced. Such rubber printing plates were durable, but they required complex manufacturing procedures, making these printing plates unattractive. As a result, flexographic photopolymer printing plates and the process of manufacturing them were developed.

Compositions useful for the manufacture of flexographic photopolymer printing plates are generally made by blending a flexible polymer (i.e., a flexomer), an appropriate crosslinking agent, and a photoinitiator to allow room temperature reaction of the flexomer with the crosslinking agent upon exposure of the blend to actinic radiation. Small amounts of other chemicals, such as antioxidants, antiozonants or dyes, are sometimes added. Useful compositions can also be made using flexomers that react by chain extensions.

"Actinic radiation" as used herein refers to radiation that initiates a chemical reaction and is intended to include ultraviolet radiation, electromagnetic wavelengths other than the ultraviolet and nonelectromagnetic radiation such as electron beams. The use of actinic radiation to initiate a crosslinking or chain extension reaction does not exclude the use of additional initiation methods, such as heat. Generally, flexographic photopolymer printing plates are photoinitiated using ultraviolet (UV) radiation.

Flexographic photopolymer printing plates are generally made using the following steps. Typical components of a photoinitiatable polymeric blend, including a flexomer, a crosslinking agent, and a photoinitiator, are blended together and the blend is processed into sheets of the desired thickness and dimensions. A backing material can be adhered to the sheet and the back of the sheet can be exposed to actinic radiation for a predetermined duration to crosslink a desired thickness of the back portion of the sheet. An image which represents the subject material to be printed is placed in contact with the front of the sheet. The portions of the sheet not shielded by the image are exposed to actinic radiation for a predetermined duration. The actinic radiation initiates crosslinking or chain extension of the flexomer contained in the exposed areas of the sheet to a predetermined depth, while the flexomer in the shielded areas remains unreacted. In known compositions which are processed in organic solvents, the exposed crosslinked or chain extended flexomer is substantially impervious to water and most organic solvents, while the unexposed flexomer is permeable to or soluble in one or more organic solvents, but not substantially permeable to water.

In the prior art that uses organic processing solutions, the image on the sheet is developed by contacting the exposed sheet with an organic solvent in a development chamber. The organic solvent permeates the unreacted polymeric portion and causes it to swell and weaken. The reacted polymeric portions of the sheet remain essentially unaffected because no appreciable amount of organic solvent permeates those portions. The image made of the reacted portions is revealed by removing at least part of the unreacted polymeric portion of the photopolymer sheet. The swollen unreacted flexomer blend is at least partially removed by contact with moving brushes or other means exposing the image. Typically, substantially all the uncrosslinked polymeric portion is removed. Then, the developed sheet is removed from the development chamber and dried. Additional processing can occur. For example, the plate can receive further exposure to actinic radiation to insure complete crosslinking of any remaining unreacted components. The process for the manufacture of prior art flexographic printing plates is described in more detail in U.S. Pat. No. 4,369,246 to Chen.

The process described above is an improvement on the prior process using molded rubber printing plates but has the drawback that environmentally sensitive organic solvents are typically used. These organic solvents are often flammable, relatively hazardous, and are highly regulated by most industrialized nations.

There is thus a need for the development of novel photopolymer compositions that can be processed in aqueous media to reduce or eliminate the use of organic solvents while maintaining the benefits of flexographic photopolymer printing plates processed in organic solvents.

The recent interest in this area of research and development has led to several attempts at aqueous processable photopolymers described in, for example, U.S. Pat. No. 5,364,741 to Huynh-Tran, U.S. Pat. No. 4,517,279 to Worns, and U.S. Pat. No. 4,177,074 to Proskow. However, these "aqueous" photopolymer systems rely on environmentally sensitive components in their preferred developing solutions to achieve an acceptable processing rate. The preferred development solutions for these "aqueous" photopolymer systems also have a pH far from neutral. The Huynh-Tran system has a relatively low pH (pH of 2.9) and the Worns and Proskow systems have a relatively high pH (pH of 12.3). None of these "aqueous" photopolymer systems has effectively eliminated the use of environmentally sensitive chemicals in the processing solutions. Thus, there is a need for a water processable photopolymer composition, with acceptable processing characteristics and with physical properties suitable for use in flexographic photopolymer printing plate applications that can be processed in aqueous solutions that do not require the use of environmentally sensitive chemicals.

SUMMARY OF THE INVENTION

Accordingly, it is an object of the invention to prepare a novel photopolymer composition which is suitable for processing in an aqueous media free of environmentally sensitive chemicals and which yields a suitable flexographic photopolymer printing plate.

As described above, a flexomer blend suitable for use as a flexographic photopolymer printing plate generally includes a flexomer, a crosslinking agent, if any, and a photoinitiator. Minor amounts of one or more antioxidants, antiozonants, stabilizers, process aids, and dyes may also be present.

Previous "aqueous processable" flexographic plates have relied on a combination of a flexomer or flexomer blends having moderate swell rates in the presence of water with aggressive processing solutions to achieve acceptable processing rates. Prior compositions did not include other components in amounts effective to significantly enhance swelling of the unreacted photopolymer composition in water and thus increase processing speed in aqueous media.

Enhanced processing rates in more neutral aqueous solutions in accordance with the present invention have been achieved by combining a flexomer, a crosslinking agent, and at least one compatible swell enhancing component that is not suitable for use as the sole flexomer in a flexographic photopolymer printing plate, regardless of processing media. A compatible swell enhancing component may include an incompatible swell enhancing filler and a compatibilizer used together. Use of significant amounts of a single compatible component that combines the features of an incompatible swell enhancing filler and a compatibilizer would also be acceptable. The compatibilizer preferably comprises a chemical with a plurality of constituents of different degrees of hydrophilicity which aids the blending and compatibilizing of the swell enhancing filler with the flexomer or flexomer blend.

To process a flexographic photopolymer plate after the image has been exposed, the unreacted portion must be softened and at least partially removed. The unreacted portion refers to those parts of the flexographic printing plate that have substantially failed to undergo a crosslinking or chain extension reaction and, therefore, remain susceptible to removal with solvents and/or a rubbing action. Typically, the unreacted portions are not exposed to actinic radiation which initiates the reaction in the remaining portions of the flexographic plate. Removal of the unreacted portion can be accomplished by submerging the exposed plate in, or contacting the partially submerged face of the plate with, a liquid that has an affinity for the unreacted portion of the composition. This liquid is frequently referred to as a "solvent" and it may, but does not necessarily, dissolve any component of the photopolymer composition. Instead, the liquid has an affinity for one or more of the components of the photopolymer composition, and therefore penetrates the unreacted photopolymer composition, swelling and weakening the unreacted photopolymer composition. The swollen unreacted portions are then removed using abrasive brushes, liquid jets, or other means. Removing the outside uncrosslinked material exposes additional uncrosslinked photopolymer composition to the processing liquid. This process can be continued until substantially all the uncrosslinked photopolymer composition is removed and the image represented by the "raised" or thicker crosslinked portions is fully revealed.

The photosensitive flexographic printing plate of the invention is made up of a layer of the aforementioned water processable photopolymer composition and, optionally, an integral or separate support layer.

Definitions

As used herein, "flexomer" means a crosslinkable or chain extendable polymeric molecule which is capable of reacting with the crosslinking agent or a blend of crosslinking agents or by chain extension to form a flexible crosslinked sheet which is suitable for use in a flexographic printing plate upon exposure to actinic radiation, usually in the presence of a photoinitiator. Flexomers are generally elastomers but nonelastomeric polymers that are suitable for use in a flexographic printing plate are also flexomers. Unless clearly excluded by the context, the term "flexomer" includes a single polymer or blends of two or more different polymers, at least one of which is capable of reacting with the crosslinking agent, blend of crosslinking agents or by chain extension to form a flexible sheet upon exposure to actinic radiation. The crosslinked or chain extended portions of the flexomer sheet have a significantly different affinity for the processing solution than the unreacted portions of the flexomer sheets.

As used herein, "hydrophilic flexomer" is a flexomer that exhibits a water swell rate of at least 10% when exposed to an aqueous solution for 22 hours or less at a temperature of 100° C. or less.

As used herein, "crosslinking agent" means a molecule that has at least two functional groups capable of reacting with two or more molecules of the flexomer to create a flexible crosslinked polymer network having a substantially greater molecular weight than the flexomer. Unless clearly excluded by the context, the term crosslinking agent, includes a single crosslinking agent or blends of two or more crosslinking agents.

As used herein, "compatibility" is the ability of two or more constituents to remain dispersed within one another without causing appreciable scattering of actinic radiation. Compatibility is often limited by the relative proportions of the constituents and incompatibility is evidenced by formation of haze in the photosensitive composition. Some slight haze of layers formed from such compositions before or during exposure can be tolerated in the preparation of printing reliefs therefrom but when finer detail is desired, haze is preferably avoided. The amount of crosslinker used is therefore limited to those compatible concentrations below that which produce undesired light scatter or haze.

As used herein, "chain extension" refers to those types of chain extension reactions described in U.S. Pat. No. 5,364,741 to Huynh-Tran et. al., column 7, line 35 to column 10, line 21.

As used herein, "flexomer blend" means a blend of one or more flexomers with one or more photoinitiators, and if a chain extending reaction is not used, one or more crosslinking agents, and excludes other components.

As used herein, "compatible swell enhancing component" means one or more chemicals that substantially increases the volume swell in water of a photopolymer composition to which it is added over any swell in the absence of such compatible swell enhancing component, while producing a photopolymer composition with acceptable clarity, flexibility, ink resistance, surface tack, and mechanical cohesiveness. In general, it is desirable that the increase in the volume, produced by the compatible swell enhancing component, be at least 10 vol %, preferably at least 20 vol % in water at 70° C. When more than one chemical is used to enhance the swell of the photopolymer composition, one or more of the chemicals may individually be incompatible with some of the other components of the photopolymer composition.

In a preferred photopolymeric composition of the invention, three components are used which together enhance the swell rate and together are compatible with the flexomer blend. These three components are a swell enhancing filler, a hydrophilic plasticizer, and a compatibilizer. In a more preferred photopolymeric composition, a surfactant is also used. In each case, the swell enhancing components are believed to react more slowly or not at all with the crosslinking agent than the rate at which the crosslinking agent reacts with the flexomer.

As used herein, "flexographic photopolymer sheet" means a sheet of material, without an image, made to a specified thickness and dimension, which is suitable for processing into a flexographic printing plate with an image.

As used herein, "photopolymeric composition" means a composition of matter that undergoes a chemical reaction upon exposure to actinic radiation and includes flexomer blends and flexomer blends to which one or more compatible swell enhancing components have been added. "Photopolymeric compositions" may also include small amounts of other known components such as antioxidants, antiozonants or dyes.

As used herein, "swell enhancing filler" means a constituent that increases the volume swell of the flexomer blend in the presence of water at the same temperature but which is not itself suitable for use as a flexomer in a flexographic photopolymer printing plate.

As used herein, "PHF" means parts per hundred parts flexomer by weight. PHF is calculated by dividing the weight of a component by the weight of all the flexomers present and multiplying the result by 100.

As used herein, "acceptable washout rate" means a washout rate of at least 0.0007 inch/minute in a Williamson A-2 washout unit without any other processing to remove unreacted portions of the sheet.

As used herein, a "compatibilizer" is a chemical or blend of chemicals that reduces the haze and/or improves the mechanical properties of a photopolymer composition to which it is added. A preferred compatibilizer comprises a chemical with a plurality of constituent chemical groups with different degrees of hydrophilicity.

As used herein, an "environmentally sensitive chemical" is a chemical that, when present in a washout solution in recommended concentrations, renders the washout solution incapable of being disposed of in municipal water treatment systems without processing of the washout solution before disposal for the purpose of reducing or eliminating the environmental impact of the washout solution. The following chemicals have been used to aid the processing of flexographic printing plates and are environmentally sensitive: organic solvents, glycol ethers, sodium hydroxide and other bases in concentrations that yield a pH greater than 12, lactic acid or other acids in concentrations that yield a pH less than 3.

A washout solution free of organic solvents, glycol ethers, and with a pH greater than 3 and less than 12 will be referred to as an "environmentally friendly washout solution."

DETAILED DESCRIPTION

The invention is a photopolymeric composition comprising a flexomer blend, combined with one or more compatible swell enhancing components. The preferred swell enhancing component includes an incompatible swell enhancing filler, a hydrophilic plasticizer, a compatibilizer and a surfactant used together.

The Flexomer

Flexomers suitable for use with the invention are crosslinkable or chain extendable polymers and blends thereof, which are suitable for use in flexographic printing plates. Hydrophilic flexomers, particularly carboxylated flexomers, are preferred. Flexomers having a carboxyl content of 7% or greater are particularly useful. A most preferred flexomer has a carboxyl content greater than about 15%. The invention, however, includes flexomers having reduced hydrophilic tendencies and/or a lower carboxyl content such as those disclosed in U.S. Pat. No. 4,177,074 to Proskow, U.S. Pat. No. 4,517,279 to Worns, and U.S. Pat. No. 4,198,241 to Bronstert, which disclosures are incorporated herein by reference.

Other examples of suitable flexomers include ABA block copolymers wherein each A is a nonelastomeric polymer block and each B is an elastomeric polymer block. Typical ABA block copolymers which can be used in this invention are polystyrene-polybutadiene-polystyrene and polystyrene-polyisoprene-polystyrene. The latter block copolymer is available from Shell Oil Company under the trade name "Kraton." Other suitable ABA type copolymers are described in U.S. Pat. No. 4,427,759 to Gruetzmacher et. al., column 2, line 65 to column 4, line 38; U.S. Pat. No. 4,423,135 to Chen et. al., column 3, line 56 to column 5, line 35; and U.S. Pat. No. 4,894,315 to Feinberg et. al., column 2, line 40 to column 5, line 14, which disclosures are incorporated herein by reference. While ABA copolymers can be used in the invention, they are not required. Examples of non-ABA copolymers useful in this invention include those described in U.S. Pat. No. 5,304,458 to Berrier et. al., column 3, line 11 to column 7, line 28; and U.S. Pat. No. 5,422,225 to Southwick, et al., column 2, line 35 to column 5, line 4, which disclosures are incorporated herein by reference.

Preferably, the flexomer is a crosslinkable elastomeric polymer with functional groups that have an affinity for water. The affinity of a polymer for water can be shown by immersing the polymer in water at a predetermined temperature for a predetermined time and measuring the amount that the polymer swells. Some examples of suitable polymers are: carboxylated copolymer of acrylonitrile and butadiene, carboxylated copolymer of styrene and butadiene, and carboxylated polyisoprenes, or blends of any two or more of such polymers. A specific example of a flexomer is a carboxylated copolymer of acrylonitrile and butadiene with a carboxyl content approximately equal to or greater than 7%. For example, the volume of a polymer with 7.0% carboxyl content in a matrix of 25.0% acrylonitrile and 68.0% butadiene swells about 75.8 vol % in deionized water at 100° C. after immersion for 22 hours. The volume swell rates of other flexomer examples are given in Table 1.

The carboxyl content of these polymers is determined by titration of the carboxyl units using known methods. Generally, the procedure is as follows. Upon titration, the carboxyl content is calculated from the equivalents of carboxyl groups per hundred parts resin (EPHR) multiplied by the molecular weight of the carboxyl group (45) in accordance with the equation as follows:

$$\% \text{ carboxyl} = \text{EPHR} \times 45$$

A polymer with a 7% carboxyl content that is combined with one or more compatible swell enhancing components yields an improved composition for the manufacture of flexographic photopolymer printing plates. Other flexomers with water swell rates greater than about 30 vol % after 22 hours at 100° C. are preferred for use in the invention when combined with one or more compatible swell enhancing components. Flexomers with water swell rates greater than 50 vol % after 22 hours at 100° C. are more preferred. Flexomers with water swell rates greater than 100 vol % after 22 hours at 100° C. are most preferred. Flexomers that have negative swell rates, indicating that the polymer dissolves in water, are also suitable for use in photopolymer compositions made in accordance with the invention.

TABLE 1

% Volume Swell of Different Flexomers
(22 Hours in Deionized Water at 100° C.)

| Flexomer | Carboxyl Content | % Vol. Swell |
| --- | --- | --- |
| Krynac X7.50 (1) carboxylated acrylonitrile butadiene polymer | 7.0% | 75.8% |
| Krynac X9.50 (2) carboxylated acrylonitrile butadiene polymer | 9.0% | 88.5% |
| CEC X56932 (3) carboxylated acrylonitrile butadiene polymer | 16.8% | 139.3% |

(1) Krynac X7.50 is available from the Bayer Corporation
(2) Krynac X9.50 is available from the Bayer Corporation
(3) CEC X56932 is available from Chase Elastomer Corporation, Kennedale, Texas Flexomers with higher swell rates are even more effective in photopolymer compositions of the invention. Therefore, a carboxyl content higher than 9.0% is preferred.

Prior art carboxylated acrylonitrile butadiene copolymers such as are disclosed in U.S. Pat. No. 4,517,279 to Worns and U.S. Pat. No. 4,177,074 to Proskow are limited to no more than 15% carboxyl content. In fact, lower amounts, such as 4% to 8%, are preferred in the above prior art. It has now been found that acrylonitrile butadiene copolymers with carboxyl contents greater than 15% can be made and are highly swellable in water at and below 100° C.

Another aspect of the preferred flexomer is that the acrylonitrile content is preferably not less than about 30% and more preferably greater than about 35%. Acrylonitrile is known to be slightly hydrophilic and the selection of relatively high proportions of acrylonitrile enhances the aqueous processing of the plate. High acrylonitrile proportions also increase the resistance of the processed plate to solvents typically used in the printing industry. However, acrylonitrile amounts that are too high detract from the final plate's ink resistance properties because the water used in some inks causes the reacted portion of the plate to swell in use more than is desired. Therefore, the acrylonitrile content should not be greater than about 50% and is more preferably not greater than about 45%.

A most preferred flexomer has a carboxyl content of more than about 15%, an acrylonitrile content of about 40%, with the balance being butadiene. While this flexomer is highly swellable in water and otherwise suitable for use in the manufacture of flexographic printing plates, it is desirable to have a processing rate in aqueous solutions at a pH in the range of 3 to 12 or which are free from environmentally sensitive components that is higher than this flexomer alone achieves.

In the present invention, the preferred aqueous solution can have a pH in the range of 3 to 12. A more preferred pH range is 7 to 12, while an even more preferred range is 9.5 to 11.5. A most preferred range of pH is from 10 to 11. A particularly useful pH is about 10.5.

The Crosslinking Agent

The processing rate of a flexographic photopolymer printing plate is enhanced by use of hydrophilic crosslinking agents. The processing rate is further enhanced by use of a blend of both hydrophilic and hydrophobic crosslinking agents.

Any suitable crosslinking agent can be employed. Classes of presently preferred suitable crosslinking agents are: a) ethoxylated monomers, b) propoxylated monomers, and c) combinations of ethoxylated and propoxylated monomers. Other hydrophilic crosslinking agents and conventional crosslinking agents and blends thereof are also effective. A detailed list of conventional crosslinking agents is given in U.S. Pat. No. 5,364,741 to Huynh-Tran and U.S. Pat. No. 4,177,074 to Proskow, which are incorporated herein by reference.

The most preferred crosslinking agent blend includes both an ethoxylated triacrylate (with a molecular weight of approximately 1000) and a propoxylated diacrylate )with a molecular weight of approximately 300). The preferred ethoxylated triacrylate is sold by the Sartomer Company as SR9035 and is considered hydrophilic. The preferred propoxylated diacrylate is sold by the Sartomer Company as SR9003B and is not considered hydrophilic. It has been found that a blend of hydrophilic and hydrophobic crosslinking agents provides a faster processing rate than either a hydrophilic or hydrophobic crosslinking agent alone provides.

The crosslinked agent or blend of crosslinking agents is preferably used in an amount not greater than about 100 PHF. A hydrophilic crosslinking agent is preferably used in amounts not greater than about 50 PHF. More preferably a hydrophilic crosslinking agent is used in an amount in the range of about 5 PHF to about 30 PHF. Even more preferably, a hydrophilic crosslinking agent is used in an amount in the range of about 10 PHF to about 20 PHF. Most preferably, the hydrophilic crosslinking agent is used in the amount of about 15 PHF.

A non-hydrophilic crosslinking agent is preferably used in amounts not greater than about 50 PHF. More preferably, a non-hydrophilic crosslinking agent is used in an amount in the range of about 5 PHF to about 30 PHF. Even more preferably, a non-hydrophilic crosslinking agent is used in an amount in the range of about 10 PHF to about 20 PHF. Most preferably, the non-hydrophilic crosslinking agent is used in the amount of about 15 PHF.

When a blend of hydrophilic and non-hydrophilic crosslinking agents is used, the weight ratio of the hydrophilic crosslinking agent to non-hydrophilic crosslinking agent is preferably in the range of about 75:25 to about 25:75. More preferably, the weight ratio of hydrophilic crosslinking agent to non-hydrophilic crosslinking agent is in the range of about 66:33 to about 33:66. Even more preferably, the weight ratio of hydrophilic crosslinking agent to non-hydrophilic crosslinking agent is in the range of about 55:45 to about 45:55. Most preferably, the weight ratio of hydrophilic crosslinking agent to non-hydrophilic crosslinking agent is about 50:50.

The Photoinitiator

Another ingredient of the water processable photosensitive composition is an actinic radiation sensitive free radical generating molecule referred to in the industry as a photoinitiator. It is not believed that the particular photoinitiator is critical, and any photoinitiator that produces an acceptable reaction rate upon exposure to actinic radiation can be used. A detailed list of available photoinitiators is given in U.S. Pat. No. 5,496,684 to Farber et al. and U.S. Pat. No. 5,496,685 to Farber and Hughes. The preferred photoinitiator is a benzyl dimethyl ketal. The photoinitiator is preferably used in an amount of less than about 10 PHF. More preferably, the photoinitiator is used in an amount in the range of about 0.5 PHF to about 5 PHF. Most preferably, the photoinitiator is used in the amount of 2 PHF.

General Description of the Compatible Swell Enhancing Component

The use of compatible swell enhancing components causes the photopolymer composition to swell and process faster in an aqueous solution than a flexomer with conventional crosslinking agents, if any, and photoinitiators alone. Yet, surprisingly, the compatible swell enhancing components do not prevent the processing of the plate in the areas where reaction has occurred or degrade the characteristics of the plate in use despite the inclusion of hydrophilic components in the reacted polymer sheet.

The higher processing rates of the combination of a water swellable flexomer blend and one or more compatible swell enhancing components can be shown by the fact that the combination swells more in water than the flexomer alone under the same conditions. For the preferred compositions, the percent volume swell for the photopolymer composition is more in deionized water at 70° C. than the flexomer alone at 100° C. after 22 hours. Thus, unexpectedly, a new composition of matter has been discovered that allows processing of flexographic photopolymer printing plates at acceptable rates in an aqueous solution with a pH less than 12 and greater than 3 and which does not require environmentally sensitive components in the processing solution. Of course, the photopolymer composition of the invention can be processed in more extreme pH conditions or with environmentally sensitive components, if desired.

Currently known swell enhancing components include organic compounds containing functional groups which are recognized as hydrophilic such as $-NH_2$, $-OH$, and $-COOH$. See also, "Structural Design of Water Soluble Copolymers," McCormick, published in the *American Chemical Society Symposium Series*, Number 467, 1989, for a discussion of hydrophilic functional groups.

The one or more chemicals included in the swell enhancing component must together be compatible with the flexomer. If the flexomer and one or more chemicals included in the swell enhancing component are not sufficiently compatible, the composition will be hazy, may have an oily surface, or may not form a cohesive sheet.

The compatible swell enhancing component allows processing of both the reacted and unreacted portion of the flexographic photopolymer printing plate because the unreacted portions wash out as desired while the reacted portions resist degradation during washout despite the inclusion of hydrophilic functional groups within the reacted portions. Desired attributes in the swell enhancing component include the ability to adequately blend into the flexomer to form a sheet with attributes suitable for the expected processing steps. If desired, two, three or more chemicals may be and preferably are used together to form the compatible swell enhancing component. A single chemical such as a compatible swell enhancing filler which combines the functions of swell enhancement and compatibilization may also be used.

When a single compatible swell enhancing filler is used as the swell enhancing component, it is preferably used in amounts not less than about 2 PHF and not greater than about 100 PHF. More preferably, a compatible swell enhancing filler is present in the amounts not less than 10 PHF and not greater than about 90 PHF. Even more preferably, a compatible swell enhancing filler is present in amounts not less than 30 PHF and not greater than about 70 PHF. Most preferably, a compatible swell enhancing filler is present in the amount of about 55 PHF.

A preferred photopolymer composition includes a water swellable flexomer, a hydrophilic crosslinking agent, a non-hydrophilic crosslinking agent, a photoinitiator, and a swell enhancing component, the latter including four different chemicals. The four chemicals of the swell enhancing component preferably comprise an incompatible swell enhancing filler with a number average molecular weight of about 100,000, a hydrophilic plasticizer with a molecular weight of approximately 400 to 1,000, a compatibilizer with a combination of functional groups that are hydrophilic to different degrees and a surfactant that further increases the compatibility of the constituents of the photopolymer composition. One or more of the functional groups in the compatibilizer may be non-hydrophilic. The presence of two or more functional groups in the compatibilizer aids in blending and compatibilizing the photopolymer composition to form sheets with acceptable physical attributes.

The Swell Enhancing Filler

An ingredient of the preferred water processable photopolymer composition of the invention is a swell enhancing component including at least one swell enhancing filler. The swell enhancing filler increases the volume swell in the presence of water of the flexomer blend. Preferably, the filler also reduces the surface tack of the composition.

Specific classes of swell enhancing fillers which are suitable for use with the invention are: a) polyethylene oxides; b) polyvinyl alcohols, available, e.g., from Air Products and Chemicals, Inc.; c) starches, e.g., corn starch available at most local grocery stores; d) cellulose and cellulose based derivatives, e.g., Methocel™, available from the Dow Chemical Company; e) gelatin; and f) polyacrylamides. These swell enhancing fillers enhance the swell rate of the photopolymer composition but are not sufficiently compatible to allow their use without additional chemicals to make all constituents of the photopolymer composition compatible with each other.

The preferred swell enhancing filler is a polyethylene oxide which, alone, is incompatible with known flexomer blends. Polyethylene oxides vary in molecular weight from about 100,000 to several million with the lower molecular weights preferred, i.e., about 100,000 to about 200,000. A specific example of a polymeric swell enhancing filler of this type is Polyox N-10™, available from the Union Carbide Chemicals and Plastics Company. It should be noted that the higher molecular weight polyethylene oxide resins make suitable photopolymer compositions, but the wash rates are less than for the lower molecular weight versions. Swell enhancing fillers with molecular weights significantly below about 100,000 are less preferred as they may lead to degradation of the reacted portion of the plate during processing and use.

When using an incompatible swell enhancing filler, it is preferably present in amounts not less than about 2 PHF and not greater than about 50 PHF. More preferably, an incompatible swell enhancing filler is present in amounts not less than about 5 PHF and not greater than about 30 PHF. Even more preferably, an incompatible swell enhancing filler is present in amounts not less than about 10 PHF and not greater than about 20 PHF. Most preferably, an incompatible swell enhancing filler is used in the amount of 15 PHF.

The Plasticizer

The preferred photopolymer composition includes a hydrophilic plasticizer which aids in blending the other components of the photopolymer composition. Acceptable hydrophilic plasticizers include: a) ethylene oxide condensates with molecular weights ranging from about 200 to about 3000, b) propoxylated polyglycols and other polypropylene oxide condensates, c) blends of ethoxylated and propoxylated polyglycols, and d) amino polyglycols. The molecular weight is not narrowly critical, but is chosen for compatibility with the other components. The preferred hydrophilic plasticizer is an ethoxylated polyglycol with a molecular weight between about 400 and about 1000. An ethoxylated polyglycol with a molecular weight of about 400 is commercially available from the Dow Chemical Company under the name E400 and from Union Carbide Chemicals and Plastics under the name PEG400, and is most preferred for use with the preferred polymeric swell enhancing filler, Polyox N-10, mentioned in the preceding section.

The use of a plasticizer is not essential but if one is used, it is preferably used in amounts not greater than about 50 PHF. More preferably, the plasticizer is used in amounts not less than about 5 PHF and not greater than about 30 PHF. Even more preferably, the plasticizer is used in amounts not less than 10 PHF and not greater than about 20 PHF. Most preferably, the plasticizer is present in the amounts of 15 PHF.

The Compatibilizer

An ingredient in the most preferred water processable photopolymer composition is the compatibilizer. This material has the characteristic of rendering the other constituents of the water processable photopolymer composition "compatible" with each other and giving the composition the necessary properties for processing. The compatibilizer has a first hydrophilic part and a second part that together help achieve compatibility with the different ingredients of the water processable photopolymer composition. The second part of the compatibilizer may be either hydrophobic or hydrophilic so long as it is different from the first hydrophilic part and helps achieve compatibility. The benefit of a compatibilizer is to bring the rubber based elastomeric flexomer together with the hydrophilic components of the preferred photopolymer composition. This effect is similar to the effect of a detergent washing out an oil spot from clothes.

Materials which are suitable as compatibilizers are: a) glycol esters such as propane diol dibenzoates, polypropylene glycol dibenzoates, triethylene glycol caprylate, tetraethylene glycol caprylate, tri and tetraethylene glycol dipelargonates, diethylene glycol monolaurates, b) thioglycol esters, i.e., dibutyl methylene bis-thioglycolate, known as Vulkanol 88, available from the Bayer Corporation, c) soaps, and d) detergents.

A preferred compatibilizer is from the glycol ester family. A specific example is dipropylene glycol dibenzoate, commonly known in the elastomer field as K-Flex, manufactured by Kalama.

When the preferred incompatible swell enhancing filler is used, at least one compatibilizer is essential to the invention. The compatibilizer is preferably used in amounts not greater than about 50 PHF. More preferably, the compatibilizer is used in amounts not less than about 5 PHF and not greater than about 45 PHF. Even more preferably, the compatibilizer is used in amounts not less than 15 PHF and not greater than about 35 PHF. Most preferably, the compatibilizer is used in the amount of about 20 PHF.

Surfactant

A more preferred photopolymer composition includes both a compatibilizer and a surfactant. Surfactants that are compatible with the other elements of the photopolymeric composition may be used. A specific example is a photopolymer composition containing a surfactant called Tween 20 available from ICI surfactants.

When a surfactant is used, it is preferably used in amounts not greater than 20 PBHR. More preferably, a surfactant is used in amounts not less than about 1 PHF and not greater than about 10 PHF. Even more preferably, a surfactant is used in amounts not less than 2 PHF and not greater than about 8 PHF. Most preferably, a surfactant is used in the amounts of about 5 PHF.

Characteristics of the Photopolymer Composition

Table II illustrates the effects of water processable photopolymer compositions with different levels of carboxylation of the flexomers in different washout solutions. Table II shows that higher concentrations of Phoenix™ cleaning solution increases the percent swell for the lower percent carboxylation polymer, and increases the dissolution rate for the higher percent carboxylation polymers. Table II is also given to describe the % volume swell versus composition, time and concentration of Phoenix™. Phoenix™ is a water-based environmentally friendly cleaning solution, commercially available from Albar Labs in Fort Worth, Tex.

TABLE II

% Volume Swell vs. Photopolymer Composition
in Various Concentrations of Phoenix ™ at 60° C.
(water-based cleaner or resin emulsifier)
*Note: negative values indicated a partially dissolved sample

| Formula | Elapsed Time | 2% Phoenix ™ | 5% Phoenix ™ | 10% Phoenix ™ | 20% Phoenix ™ |
|---|---|---|---|---|---|
| 3009 | 4 hours | 27.2% swell | 37.0% swell | 51.5% swell | 71.2% swell |
| (9.5%) | 22 hours | 55.1% swell | 69.3% swell | 123.8% swell | 184.3% swell |
| 3015 | 4 hours | -.2% swell | -21.1% swell | -42.9% swell | -38.0% swell |
| (16.8%) | 22 hours | -13.3% swell | -80.2% swell | -84.3% swell | -88.6% swell |

% Volume Swell Test

The % volume swell test is performed as follows:
1. Cut the polymer or composition into a piece weighing approximately 1.0–1.5 g
2. Weigh sample in air ($Wa_1$)
3. Weigh sample in water ($Ww_1$)
4. Place sample in the test solution for a given time and temperature. The results reported herein were for samples placed in water for 22 hours at 60° C. unless otherwise indicated.
5. Remove sample from test solution
6. Pat sample dry
7. Reweigh sample in air ($Wa_2$)
8. Reweigh sample in water ($Ww_2$)
9. Calculate % volume swell via equation 1 $Wa_1-Ww_1$= Volume 1 $Wa_2-Ww_2$=Volume 2

$$100 \times \frac{Vol.2 - Vol.1}{Vol_1} = \% \ Vol. \ swell \qquad \text{Equation 1}$$

Washout Rates

The washout rate test is performed by taking a sheet of uncured or uncrosslinked water processable photopolymer composition and placing it in a washout unit comprising a flat plate to which the sheet is adhered, and an orbital brushing surface containing brushes with 8 mil bristles in a given solution, at a set temperature. After a predetermined time, the sample is removed from the washout unit, dried, and the sample thickness is measured. The decrease in thickness in thousandths of an inch divided by the time (in minutes) defines the washout rate in thousandths of an inch per minute. Higher washout rates are preferred when coupled with acceptable engineering and use characteristics.

Characteristics and Physical Properties of Flexographic Photopolymer Printing Plates The most viable water washable photopolymer composition will possess both acceptable processing characteristics for imaging and development, and superior physical properties for performance and long life in use. Preferably, a photopolymer composition will have a Shore A hardness of not less than 25 and not greater than 65. Preferably, a photopolymer composition will have a tensile strength of not less than 250 pounds per square inch and a tear strength not less than 40 pounds per linear inch. Preferably, a photopolymer composition will have an elongation not less than 200%, a permanent set not greater than 30% and a 100% modulus not less than 100.

Methods of Production

The water processable photopolymer compositions of the invention can be produced via several standard methods known in the industry. The selected components may be blended into a homogeneous material in any type of suitable mixing equipment, such as: open mills, internal mixers, compounding extruders, solutions, or other types known in the industry.

These water processable photopolymer compositions can be formed into useable sheets of industry standard thicknesses by known methods. These forming methods include: extrusion and calendering at ambient or elevated temperatures, hot pressing, solvent casting, solutions, or other means known in the industry.

Washout Solutions

The recommended washout solutions for use with the photopolymer compositions of the present invention are all based on at least 95% water by weight. The remaining components of the washout solutions are composed of salts, surface active agents, pH modifiers, and other known components to enhance the wash rate of the photopolymer composition so long as the pH is maintained greater than 3 and less than 12.

A non-exhaustive list of salts which enhances the washout solution includes: a) ammonium and other common cation salts of benzene sulfonic acid, b) sodium and other common cation carbonates, bicarbonates, sesquicarbonates, sulfates, or phosphates, and c) other compounds which can be added to a solution to modify pH for more basic solutions.

A non-exhaustive list of surface active agents includes: a) a commercially available cleaning solution, known as Microclean™, which is a blend of salts, soaps, and surfactants, b) another commercially available surfactant, known as Tween 20, available from ICI Surfactants, and others in its class, and c) other compounds which can be added to solutions to initiate detergent or micelle effects.

A non-exhaustive list of other additives to enhance the washout solution includes: a) common household ammonia available from most local grocery stores, b) a commercially available environmentally safe cleaning solution, known as Phoenix (a blend of salts, soaps, surfactants, glycol ethers and alkali), available from Albar Labs, Fort Worth, Tex. (5% solutions), c) various glycol ethers, and d) other types of chemicals in this class of chemicals which not only swell the composition, but slightly alter the pH of the solution, both of which enhance the resulting washout of the photopolymer composition.

The washout solution is generally considered nonhazardous and also effective to produce acceptable washout rates when the combination of salts, surfactants, and pH modifiers have an overall pH preferably within the range of 7.0 to 11.9 and more preferably between the range of 9.5 to about 11.5 and most preferred from about 10.0 to about 11.0. When compared to other washout solutions for currently available "aqueous processible" flexographic photopolymer printing plates, these solutions are closer to neutral pH and are free from environmentally sensitive components.

Generally, higher washout rates are obtained using higher temperature. A washout temperature not greater than about 100° C. and not less than about 20° C. is preferred. More preferably, the washout temperature is not less than about 30° C. and not greater than about 70° C. Even more preferably, the washout temperature is not less than about 40° C. and not greater than about 60° C. Most preferably, the washout temperature is about 50° C.

EXAMPLE 1

A water washable photopolymer was prepared by mixing the following components on a two-roll steel mixing mill:

| Formulation Components | PFH |
| --- | --- |
| Flexomer Blend: | |
| Flexomer | 100 |
| Krynac X 9.50 carboxylated nitrile | |
| Crosslinking Agent | 10 |
| Sartomer SR-9035 ethoxylated triacrylate | |
| Photoinitiator | 1 |
| Sartomer KB-1 benzyl dimethylketal | |
| Compatible Swell Enhancing Component: | |
| Swell Enhancing Filler | 10 |
| Union Carbide Polyox N-10 polyethylene oxide | |
| Plasticizer | 10 |
| Dow polyethyleneglycol E 400 | |
| Compatibilizer | 20 |
| Dipropylene glycol dibenzoate (K-Flex) | |
| Total | 151 |

The above material was mixed until homogeneous. Mixing time was about 20 to 30 minutes using a temperature controlled mill.

After the material was mixed, a sheet was molded in a press with a suitable mold to a desired thickness such as 0.067 inch (1.70 mm), with a 5 mil (0.13 mm) polyester support on one side and a protective slip film on the other side. Upon molding, the majority of the encapsulated air is removed, yielding a clear sheet. After an initial period of time in the mold at an elevated temperature, i.e., about ten minutes at 150° F., cooling water is circulated through the press to return the material to ambient temperatures.

This clear sheet comprised of the photopolymer composition can then be used to make a flexographic printing plate containing an image by exposing the sheet as described above.

Development or washout of the exposed sheet is performed by placing the exposed sheet in an appropriate washout unit equipped with brushes and heaters to heat the washout solution to the desired temperature. For the above water washable photopolymer composition which has been formed into a plate of given thickness, the following washout conditions were used:

Washout Solution: 5% ammonia solution with pH of 10.0
Washout Temperature: 60° C.
Washout Time: 30 minutes The photopolymer composition of Example 1 had a washout rate of 0.0010 inch per minute.

The photopolymer composition of Example 1 had a volume swell of 45 vol % after 22 hours in a solution of one quart of household ammonia and 50 ml of Microclean™ mixed in 10 gallons of water at 60° C.

The washout solution used was an ammonia solution having a pH of about 10.0, prepared by mixing one quart of household ammonia in 10 gallons of tap water. This solution will be referred to herein as a 5% ammonia solution. The washout solution was maintained at a temperature of 60° C. throughout the procedure. The resulting product is a strong, flexible composition, which is suitable for printing applications with adequate relief, fine lines and screens, sharp detail, and open reverses with an acceptable washout rate.

EXAMPLE 2

A water washable photopolymer was prepared by mixing the following components on a two-roll steel mixing mill:

| Formulation Components | PHF |
|---|---|
| Flexomer Blend: | |
| Flexomer | 100 |
| Goodyear X54990 carboxylated nitrile | |
| (about 16% carboxyl groups) | |
| Crosslinking Agent | 10 |
| Sartomer SR-9035 ethoxylated triacrylate | |
| Photoinitiator | 1 |
| Sartomer KB-1 benzyl dimethylketal | |
| Compatible Swell Enhancing Component: | |
| Swell Enhancing Filler | 10 |
| Union Carbide Polyox ™ N-10 polyethylene oxide | |
| Plasticizer | 10 |
| Dow polyethyleneglycol E 400 | |
| Compatibilizer | 20 |
| Dipropylene glycol dibenzoate | |
| Total | 151 |

The above material was mixed and exposed as in Example 1. The exposed sheet was developed using the following washout conditions:

Washout Solution: 5% ammonia solution with Microclean™ surfactant and a pH of 10.0

Washout Temperature: 60° C.

Washout Time: 30 minutes

The photopolymer composition of Example 2 had a washout rate of 0.0015 inch per minute which is fifty percent (50%) higher than the washout rate for the photopolymer composition of Example 1. This shows the improved washout rate obtained by increasing the amount of carboxylation of the flexomer. The photopolymer composition of Example 2 had a volume swell of 160 vol % under the same conditions referenced in Example 1.

EXAMPLE 3

A water washable photopolymer was prepared by mixing the following components on a two-roll steel mixing mill:

| Formulation Components | PHF |
|---|---|
| Flexomer Blend: | |
| Flexomer | 100 |
| Goodyear X56932 carboxylated nitrile | |
| (about 16.8% carboxyl groups) | |
| Crosslinking Agent | 10 |
| Sartomer SR-9035 ethoxylated triacrylate | |
| Photoinitiator | 1 |
| Sartomer KB-1 benzyl dimethylketal | |
| Compatible Swell Enhancing Component: | |
| Swell Enhancing Filler | 10 |
| Union Carbide Polyox ™ N-10 polyethylene oxide | |
| Plasticizer | 10 |
| Dow polyethyleneglycol E 400 | |
| Compatibilizer | 20 |
| Dipropylene glycol dibenzoate | |
| Total | 151 |

The above material was mixed and exposed as in Example 1. The exposed sheet was developed using the following washout conditions:

Washout Solution: 5% Phoenix™ solution with pH of 10.5

Washout Temperature: 65° C.

Washout Time: 30 minutes

The sheet of Example 3 had a washout rate of 0.0013 inch per minute. Phoenix™ is an environmentally friendly blend of cleaning solutions which is less aggressive than ammonia at similar concentrations. Example 3 shows that acceptable processing rates are obtainable with mild processing solutions.

EXAMPLE 4

A water washable photopolymer was prepared by mixing the following components on a two-roll steel mixing mill:

| Formulation Components | PHF |
|---|---|
| Flexomer Blend: | |
| Flexomer | 100 |
| Goodyear X56932 carboxylated nitrile | |
| Crosslinking Agent | 10 |
| Sartomer SR-9035 ethoxylated triacrylate | |
| Photoinitiator | 1 |
| Sartomer KB-1 benzyl dimethylketal | |
| Compatible Swell Enhancing Component: | |
| Swell Enhancing Filler | 10 |
| Union Carbide Polyox ™ N-10 polyethylene oxide | |
| Plasticizer | 10 |
| Dow polyethyleneglycol E 400 | |
| Compatibilizer | 20 |
| Dipropylene glycol dibenzoate | |
| Total | 151 |

The above material was mixed as in Example 1. The exposed sheet was developed using the following washout conditions:

Washout Solution: Sodium sesquicarbonate solution with pH of 10.0

Washout Temperature: 65° C.

Washout Time: 30 minutes

The sheet of Example 4 had a washout rate of 0.0010 inch per minute. Sodium sesquicarbonate is a salt which yields a moderate pH upon dissolution in water. Example 4 shows that acceptable processing rates are obtainable with mild processing solutions.

EXAMPLE 5

A water washable photopolymer was prepared by mixing the following components on a two-roll steel mixing mill:

| Formulation Components | Parts |
| --- | --- |
| Flexomer Blend: | |
| Flexomer | 100 |
| Goodyear X56932 carboxylated nitrile | |
| Crosslinking Agent | 10 |
| Sartomer SR-9035 ethoxylated triacrylate | |
| Photoinitiator | 1 |
| Sartomer KB-1 benzyl dimethylketal | |
| Compatible Swell Enhancing Component: | |
| Swell Enhancing Filler | 10 |
| Union Carbide Polyox ™ N-10 polyethylene oxide | |
| Plasticizer | 10 |
| Dow polyethyleneglycol E 400 | |
| Compatibilizer | 20 |
| Dipropylene glycol dibenzoate | |
| Other Additives: | |
| Dye | 0.02 |
| Dye (Green) | |
| Total | 151.02 |

The above material was mixed as in Example 1. The exposed sheet was developed using the following washout conditions:

Washout Solution: 5% Phoenix™ solution with pH of 11.0
Washout Temperature: 65° C.
Washout Time: 30 minutes The sheet of Example 5 had a washout rate of 0.0014 inch per minute

EXAMPLE 6

A water washable photopolymer was prepared by mixing the following components on a two-roll steel mixing mill:

| Formulation Components | Parts |
| --- | --- |
| Flexomer Blend: | |
| Flexomer | 100 |
| Goodyear X56932 carboxylated nitrile | |
| Crosslinking Agent | 15 |
| Sartomer SR-9035 ethoxylated triacrylate | |
| Photoinitiator | 2 |
| Sartomer KB-1 benzyl dimethylketal | |
| Compatible Swell Enhancing Component: | |
| Swell Enhancing Filler | 15 |
| Union Carbide Polyox ™ N-10 polyethylene oxide | |
| Plasticizer | 5 |
| Dow polyethyleneglycol E 400 | |
| Compatibilizer | 20 |
| Dipropylene glycol dibenzoate | |
| Total | 157 |

The above material was mixed as in Example 1. The exposed sheet was developed using the following washout conditions:

Washout Solution: 5% Phoenix solution with pH of 11.0
Washout Temperature: 60° C.
Washout Time: 30 minutes The photopolymer composition of Example 6 had a washout rate of 0.0013 inch per minute.

The photopolymer composition of Example 6 had the following physical characteristics: Shore A hardness of 46, tensile strength of 810 PSI, tear strength of 90 pounds per linear inch, elongation of 320%, percent permanent set of 17 and 100% modulus of 190.

EXAMPLE 7

A water washable photopolymer was prepared by mixing the following components on a two-roll steel mixing mill:

| Formulation Components | Parts |
| --- | --- |
| Flexomer Blend: | |
| Flexomer | 100 |
| Goodyear X56932 carboxylated nitrile | |
| Crosslinking Agent | 15 |
| Sartomer SR-9035 ethoxylated triacrylate | |
| Photoinitiator | 2 |
| Sartomer KB-1 benzyl dimethylketal | |
| Compatible Swell Enhancing Component: | |
| Swell Enhancing Filler | 5 |
| Union Carbide Polyox ™ N-10 polyethylene oxide | |
| Plasticizer | 15 |
| Dow polyethyleneglycol E 400 | |
| Compatibilizer | 20 |
| Dipropylene glycol dibenzoate | |
| Total | 157 |

The above material was mixed as in Example 1. The exposed sheet was developed using the following washout conditions:

Washout Solution: 5% Phoenix™ solution with pH of 11.0
Washout Temperature: 65° C.
Washout Time: 30 minutes The photopolymer composition of Example 7 had a washout rate of 0.0014 inch per minute. The photopolymer composition of Example 7 had the following physical characteristics: Shore A hardness of 38, tensile strength of 270 psi,, tear strength of 50 pounds per linear inch, elongation of 240%, percent permanent set of 10, and 100% modulus of 110.

EXAMPLE 8

A water washable photopolymer was prepared by mixing the following components on a two-roll steel mixing mill:

| Formulation Components | Parts |
| --- | --- |
| Flexomer Blend: | |
| Flexomer | 100 |
| Goodyear X56932 carboxylated nitrile | |
| Crosslinking Agent | 15 |
| Sartomer SR-9035 ethoxylated triacrylate | |
| Photoinitiator | 1 |
| Sartomer KB-1 benzyl dimethylketal | |
| Compatible Swell Enhancing Component: | |
| Swell Enhancing Filler | 5 |
| Union Carbide Polyox ™ N-10 polyethylene oxide | |
| Plasticizer | 15 |
| Dow polyethyleneglycol E 400 | |
| Compatibilizer | 20 |
| Dipropylene glycol dibenzoate | |
| Total | 156 |

The above material was mixed as in Example 1. The exposed sheet was developed using the following washout conditions:

Washout Solution: 5% Phoenix solution with pH of 11.0

Washout Temperature: 60° C.

Washout Time: 30 minutes

The photopolymer composition of Example 8 had a washout rate of 0.0012 inch per minute. The photopolymer composition of Example 8 had the following physical characteristics: Shore A hardness of 40, tensile strength of 540 PSI, tear strength of 60 pounds per linear inch, elongation of 290%, percent permanent set of 20 and 100% modulus of 110.

EXAMPLE 9

A water washable photopolymer was prepared by mixing the following components on a two-roll steel mixing mill:

| Formulation Components | PHF |
|---|---|
| Flexomer Blend: | |
| Flexomer | 100 |
| Goodyear X56932 carboxylated nitrile | |
| Crosslinking Agent | 15 |
| Sartomer SR-9035 ethoxylated triacrylate | |
| Photoinitiator | 2 |
| Sartomer KB-1 benzyl dimethylketal | |
| Compatible Swell Enhancing Component: | |
| Swell Enhancing Filler | 15 |
| Union Carbide Polyox ™ N-10 polyethylene oxide | |
| Plasticizer | 15 |
| Dow polyethyleneglycol E 400 | |
| Compatibilizer | 20 |
| Dipropylene glycol dibenzoate | |
| Total | 167 |

The above material was as in Example 1.

The exposed sheet was developed using the following washout conditions:

Washout Solution: 5% ammonia solution with pH of 10.0

Washout Temperature: 60° C.

Washout Time: 30 minutes

The photopolymer of Example 9 had a washout rate under the conditions above of 0.0014 inch per minute.

EXAMPLE 10

A water washable photopolymer was prepared by mixing the following components on a two-roll steel mixing mill:

| Formulation Components | Parts |
|---|---|
| Flexomer Blend: | |
| Flexomer | 100 |
| Goodyear X56932 carboxylated nitrile | |
| Crosslinking Agent | 15 |
| Sartomer SR-9035 ethoxylated triacrylate | |
| Photoinitiator | 2 |
| Sartomer KB-1 benzyl dimethylketal | |
| Compatible Swell Enhancing Component: | |
| Swell Enhancing Filler | 15 |
| Union Carbide Polyox ™ N-10 polyethylene oxide | |
| Plasticizer | 15 |
| Dow polyethyleneglycol E 400 | |
| Compatibilizer | 20 |
| Dipropylene glycol dibenzoate | |
| Surfactant | 5 |
| ICI-Tween 20 | |
| Total | 172 |

The above material was mixed as in Example 1. The exposed sheet was developed using the following three washout conditions:

Washout Solution: 5% Phoenix™ solution with pH of 11.0

Washout Temperature: 60° C.

Washout Time: 30 minutes

The photopolymer composition of Example 10 had a washout rate of 0.0017 under the washout conditions stated above. An exposed sheet of the same material was processed in the following washout conditions.

EXAMPLE 11

A water washable photopolymer was prepared by mixing the following components on a two-roll steel mixing mill:

| Formulation Components | PHF |
|---|---|
| Flexomer Blend: | |
| Flexomer | 100 |
| Goodyear X56932 carboxylated nitrile | |
| Crosslinking Agent | |
| Sartomer SR-9035 ethoxylated triacrylate | 15 |
| Sartomer SR9003B propoxylated diacrylate | 15 |
| Photoinitiator | 2 |
| Sartomer KB-1 benzyl dimethylketal | |
| Compatible Swell Enhancing Component: | |
| Swell Enhancing Filler | 15 |
| Union Carbide Polyox ™ N-10 polyethylene oxide | |
| Plasticizer | 15 |
| Dow polyethyleneglycol E 400 | |
| Compatibilizer | 20 |
| Dipropylene glycol dibenzoate | |
| Surfactant | 5 |
| ICI Tween 20 | |
| Other Additives: | |
| Dye | 0.02 |
| Green Dye | |
| Total | 187.02 |

The above material was mixed as in Example 1. The exposed sheet was developed using the following washout conditions:

Washout Solution: 5% Phoenix™ solution with pH of 10.0

Washout Temperature: 50° C.

Washout Time: 30 minutes

The photopolymer of Example 11 had a washout rate of 0.0017 inch per minute.

The photopolymer composition of Example 11 is the preferred embodiment of the invention.

Although the present invention has been described with reference to presently preferred embodiments, it will be appreciated by those skilled in the art that various modifications, alternatives, variations, etc., may be made without departing from the spirit and scope of the invention as defined in the appended claims.

We claim:

1. A photopolymer composition capable of being processed in aqueous media to form a flexographic printing plate comprising: 1) a flexomer blend having at least one hydrophilic flexomer, which is a carboxylated acrylonitrile butadiene polymer, at least one crosslinking agent, and at least one photoinitiator, and 2) at least one compatible swell enhancing filler consisting of a compound different from said hydrophilic flexomer but which is compatible with said hydrophilic flexomer such that said compatible swell enhancing filler and said hydrophilic flexomer remain dispersed within one another, wherein said compatible swell enhancing filler increases the volume swell of said flexomer blend in the presence of water.

2. A photopolymer composition according to claim 1, wherein said at least one compatible swell enhancing filler comprises not less than about 2 parts per hundred parts flexomer by weight and not greater than about 100 parts per hundred parts flexomer by weight.

3. A photopolymer composition according to claim 1, wherein said at least one compatible swell enhancing filler comprises not less than about 5 parts per hundred parts flexomer by weight and not greater than about 100 parts per hundred parts flexomer by weight.

4. A photopolymer composition according to claim 1, wherein said at least one crosslinking agent is a plurality of crosslinking agents.

5. A photopolymer composition according to claim 4, wherein said plurality of crosslinking agents comprises first and second crosslinking agents, said first crosslinking agent being a hydrophilic crosslinking agent and said second crosslinking agent being less hydrophilic than said first crosslinking agent.

6. A photopolymer composition capable of being processed in aqueous media to form a flexographic printing plate comprising: 1) a flexomer blend having at least one hydrophilic flexomer, which is a carboxylated acrylonitrile butadiene polymer, at least one crosslinking agent, and at least one photoinitiator, and 2) at least one compatible swell enhancing component comprising a) a swell enhancing filler which is incompatible with said hydrophilic flexomer, and b) at least one compatibilizer having both hydrophilic and nonhydrophilic constituents so that said compatible swell enhancing component is compatible with said hydrophilic flexomer to the extent that said compatible swell enhancing component and said hydrophilic flexomer remain dispersed within one another, said compatibilizer reducing the haze of said photopolymer composition, wherein said swell enhancing filler increases the volume swell of said flexomer blend in the presence of water.

7. A photopolymer composition according to claim 6, wherein said swell enhancing filler is present in an amount of at least about 2 parts per hundred parts flexomer by weight.

8. A photopolymer composition according to claim 6, wherein said swell enhancing filler is present in an amount of at least about 5 parts per hundred parts flexomer by weight.

9. A photopolymer composition according to claim 6 wherein said at least one crosslinking agent is a plurality of crosslinking agents.

10. A photopolymer composition according to claim 6, wherein said plurality of crosslinking agents comprises first and second crosslinking agents, said first crosslinking agent being a hydrophilic crosslinking agent and said second crosslinking agent being less hydrophilic than said first crosslinking agent.

11. A photopolymer composition according to claim 6 wherein said at least one compatible swell enhancing component further comprises c) a plasticizer.

12. A photopolymer composition according to claim 11 wherein said plasticizer has a molecular weight of approximately 400 to 1,000.

13. A photopolymer composition according to claim 6 wherein said at least one compatible swell enhancing component further comprises d) a surfactant.

14. A photopolymer composition according to claim 6 wherein said at least one compatible swell enhancing component further comprises c) a plasticizer and d) a surfactant.

15. A photopolymer composition according to claim 6 wherein said swell enhancing filler is polyethylene oxide.

16. A photopolymer composition according to claim 15 wherein said polyethylene oxide has a molecular weight of about 100,000 to about 200,000.

17. A photopolymer composition capable of being processed in aqueous media to form a flexographic printing plate comprising: 1) a flexomer blend having at least one hydrophilic flexomer, at least one crosslinking agent, and at least one photoinitiator, and 2) at least one compatible swell enhancing component comprising a) a swell enhancing filler which is polyethylene oxide, and b) at least one compatibilizer having both hydrophilic and nonhydrophilic constituents so that said compatible swell enhancing component is compatible with said hydrophilic flexomer to the extent that said compatible swell enhancing component and said hydrophilic flexomer remain dispersed within one another, said compatibilizer reducing the haze of said photopolymer composition, wherein said swell enhancing filler increases the volume swell of said flexomer blend in the presence of water.

18. A photopolymer composition according to claim 17 wherein said polyethylene oxide has a molecular weight of about 100,000 to about 200,000.

19. A photopolymer composition according to claim 17 wherein said at least one compatible swell enhancing component further comprises c) a plasticizer.

20. A photopolymer composition according to claim 17 wherein said at least one compatible swell enhancing component further comprises d) a surfactant.

21. A photopolymer composition according to claim 17 wherein said at least one compatible swell enhancing component further comprises c) a plasticizer and d) a surfactant.

* * * * *